(12) United States Patent
Kim et al.

(10) Patent No.: US 10,685,930 B2
(45) Date of Patent: Jun. 16, 2020

(54) DRIVING INTEGRATED CIRCUIT AND DISPLAY DEVICE INCLUDING THE SAME

(71) Applicant: SAMSUNG DISPLAY CO., LTD., Yongin-si, Gyeonggi-Do (KR)

(72) Inventors: Byoungyong Kim, Seoul (KR); Jeongho Hwang, Cheonan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/128,740

(22) Filed: Sep. 12, 2018

(65) Prior Publication Data
US 2019/0181111 A1 Jun. 13, 2019

(30) Foreign Application Priority Data

Dec. 12, 2017 (KR) .......................... 10-2017-0169865

(51) Int. Cl.
| | | |
|---|---|---|
| *H01L 23/498* | (2006.01) | |
| *H01L 23/00* | (2006.01) | |
| *H01L 27/12* | (2006.01) | |
| *H01L 27/32* | (2006.01) | |
| *H01L 51/52* | (2006.01) | |

(52) U.S. Cl.
CPC .......... *H01L 24/13* (2013.01); *H01L 23/4985* (2013.01); *H01L 24/14* (2013.01); *H01L 24/16* (2013.01); *H01L 24/81* (2013.01); *H01L 27/124* (2013.01); *H01L 27/1244* (2013.01); *H01L 27/3255* (2013.01); *H01L 27/3276* (2013.01); *H01L 51/524* (2013.01); *H01L 2224/13013* (2013.01); *H01L 2224/13016* (2013.01); *H01L 2224/13082* (2013.01); *H01L 2224/14131* (2013.01); *H01L 2224/14132* (2013.01);

(Continued)

(58) Field of Classification Search
CPC ......... H01L 24/13; H01L 24/81; H01L 24/16; H01L 24/14; H01L 27/124; H01L 27/3255; H01L 27/3276; H01L 23/4985; H01L 2224/13082; H01L 2224/13016; H01L 2224/13013; H01L 2224/14131; H01L 2224/14132; H01L 2224/16227; H01L 2224/81205; H01L 51/524
See application file for complete search history.

(56) References Cited

U.S. PATENT DOCUMENTS 5,545,589 A * 8/1996 Tomura .................. H01L 24/11
                                                                257/E21.508
6,228,689 B1   5/2001 Liu
(Continued)

FOREIGN PATENT DOCUMENTS

KR     10-0973878      7/2010
KR     1020120052844   5/2012

*Primary Examiner* — Sitaramarao S Yechuri
(74) *Attorney, Agent, or Firm* — F. Chau & Associates, LLC

(57) ABSTRACT

A driving chip includes a body portion including a circuit. A first bump is electrically connected to the body portion. A second bump is disposed on the first bump. The second bump has a planar area less than a planar area of the first bump on a plane defined along a first direction parallel to an upper surface of the body portion. The first bump has a length of about 60 μm or more in the first direction, a side surface of the second bump is aligned with a side surface of the first bump along a second direction orthogonal to the first direction.

20 Claims, 11 Drawing Sheets

(52) U.S. Cl.
CPC ............... *H01L 2224/16227* (2013.01); *H01L 2224/81205* (2013.01)

(56) References Cited

U.S. PATENT DOCUMENTS

| | | | |
|---|---|---|---|
| 6,246,587 B1* | 6/2001 | Chen | ........................ H01R 4/04 |
| | | | 174/260 |
| 8,258,625 B2 | 9/2012 | Fujiwara | |
| 9,768,138 B2* | 9/2017 | Shen | .................... H01L 23/3157 |
| 2006/0006531 A1* | 1/2006 | Lin | ......................... H01L 24/10 |
| | | | 257/737 |
| 2007/0145101 A1* | 6/2007 | Kataoka | ................. H01G 2/065 |
| | | | 228/101 |
| 2008/0122085 A1* | 5/2008 | Kanaoka | ............. H01L 23/3114 |
| | | | 257/737 |
| 2010/0277192 A1* | 11/2010 | Hasebe | .............. G01R 31/2889 |
| | | | 324/755.01 |
| 2011/0074022 A1 | 3/2011 | Pendse | |
| 2012/0306104 A1* | 12/2012 | Choi | .................... H01L 21/565 |
| | | | 257/782 |
| 2013/0342779 A1* | 12/2013 | Jung | .................... G02B 6/0083 |
| | | | 349/43 |
| 2017/0232738 A1 | 8/2017 | Nagahata | |

\* cited by examiner

DRIVING INTEGRATED CIRCUIT AND DISPLAY DEVICE INCLUDING THE SAME

CROSS-REFERENCE TO RELATED APPLICATION

This application claims priority under 35 U.S.C. § 119 to Korean Patent Application No. 10-2017-0169865, filed on Dec. 12, 2017, in the Korean Intellectual Property Office (KIPO), the disclosure of which is incorporated by reference herein in its entirety.

1. Technical Field

Exemplary embodiments of the present invention relate to a driving integrated circuit, and more particularly to a display device including the same.

2. Discussion of Related Art

Display devices may be classified into liquid crystal display ("LCD") devices, organic light emitting diode ("OLED") display devices, plasma display panel ("PDP") devices, or electrophoretic display devices based on a light emitting scheme thereof.

Display devices generally include a display panel displaying images and a driving chip driving the display panel. The driving chips may be mounted at an edge of the display panel. For example, the driving chip may be directly mounted on the display panel in a chip on glass (COG) manner through an anisotropic conductive (ACF) film, or may be mounted on a tape carrier package (TCP) or a flexible film in a chip on film (COF) manner to be connected to the display panel through the ACF.

Display devices may have relatively high resolution, the area of a non-display area of the display device may be relatively small, and a width and a gap of wirings may be relatively small.

SUMMARY

Exemplary embodiments of the present invention may be directed to a driving integrated circuit (e.g., a driving chip) capable of being stably connected to a display panel and to a display device including the driving chip.

According to an exemplary embodiment of the present invention, a driving chip includes a body portion including a circuit. A first bump is electrically connected to the body portion. A second bump is disposed on the first bump. The second bump has a planar area less than a planar area of the first bump on a plane defined along a first direction parallel to an upper surface of the body portion. The first bump has a length of about 60 µm or more in the first direction. A side surface of the second bump is aligned with a side surface of the first bump along a second direction orthogonal to the first direction.

The first bump may have a planar area of at least about 400 µm².

The first bump may have a height of from about 3 µm to about 5 µm in a third direction orthogonal to the first direction and the second direction.

The second bump may have a length less than a length of the first bump in the first direction.

The second bump may have a length of from about 10 µm to about 20 µm in the first direction.

The second bump may have a length of from about 8 µm to about 15 µm in the second direction.

The second bump may have a length substantially equal to a length of the first bump in the second direction.

The second bump may have a length less than a length of the first bump in the second direction.

The second bump may include a plurality of second bumps each having side surfaces respectively aligned with side surfaces of the first bump along the second direction orthogonal to the first direction.

The second bumps of the plurality of second bumps may be spaced apart from each other by a distance of about 50 µm or more in the first direction.

According to an exemplary embodiment of the present invention, a display device includes a substrate including a plurality of pixels. A pad wiring applies a driving signal to a pixel of the plurality of pixels. A driving chip generates the driving signal. The driving chip includes a body portion including a circuit generating the driving signal. A first bump is electrically connected to the body portion. A second bump is disposed on the first bump. The second bump has a planar area less than a planar area of the first bump on a plane define along a first direction parallel to an upper surface of the body portion. The second bump is in direct contact with the pad wiring. The first bump has a length of about 60 µm or more in the first direction. A side surface of the second bump is aligned with a side surface of the first bump along a second direction orthogonal to the first direction.

The first bump may have a height of from about 3 µm to about 5 µm in the second direction.

The first bump may be spaced apart from the pad wiring by a distance of from about 3 µm to about 5 µm. The second bump may have a height of from about 3 µm to about 5 µm in a third direction orthogonal to the first direction and the second direction.

The second bump may have a length less than a length of the first bump in the first direction.

The second bump may have a length of from about 10 µm to about 20 µm in the first direction.

The second bump may have a length of from about 8 µm to about 15 µm in the second direction.

The second bump may have a length substantially equal to a length of the first bump in the second direction.

The second bump may have a length less than a length of the first bump in the second direction.

The second bump may include a plurality of second bumps each having side surfaces respectively aligned with side surfaces of the first bump along the second direction orthogonal to the first direction.

The display device may include a flexible printed circuit board connected to the substrate. The substrate may include a display area in which the plurality of pixels are arranged and a non-display area adjacent to the display area. The pad wiring may be disposed on at least one of the flexible printed circuit board and the non-display area.

BRIEF DESCRIPTION OF THE DRAWINGS

A more complete appreciation of the present invention will become more apparent by describing in detail exemplary embodiments thereof with reference to the accompanying drawings, in which.

DETAILED DESCRIPTION

Figure 1:
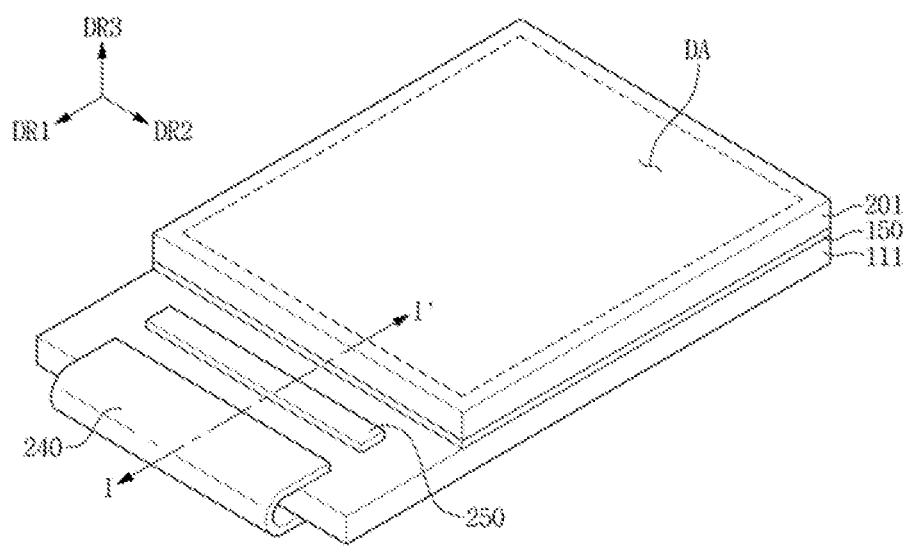
FIG. 1 is a perspective view of a display panel and a driving chip according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Sizes of elements in the drawings may be exaggerated for clarity of description. It will be understood that when a component, such as a layer, a film, a region, or a plate, is referred to as being "on" another component, the component may be directly on the other component or intervening components may be present.

Throughout the specification and drawings, when an element is referred to as being "connected" to another element, the element may be "directly connected" to the other element, or "electrically connected" to the other element with one or more intervening elements interposed therebetween.

It will be understood that although the terms "first" and "second" may be used herein to describe various components, these components should not be limited by these terms.

"About" or "approximately" as used herein may be inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Figure 2:
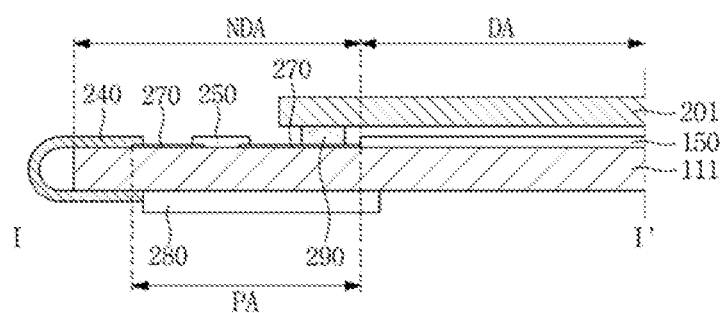
FIG. 2 is a cross-sectional view taken along line of FIG. 1.

FIG. 1 is a perspective view of a display panel and a driving chip according to an exemplary embodiment of the present invention. FIG. 2 is a cross-sectional view taken along line I-I' of FIG. 1.

Referring to FIG. 1, a display device according to an exemplary embodiment of the present invention may include a display panel, a flexible printed circuit board ("FPCB") 240, a printed circuit board 280, and a driving chip 250. The display panel may include a display area DA and a non-display area NDA. The non-display area NDA may be adjacent to the display area DA. The non-display area NDA may be arranged at four sides of the display area DA in a plan view. Thus, the non-display area NDA may surround the display area DA in a plan view. However, exemplary embodiments of the present invention are not limited thereto. For example, the non-display area NDA may be arranged at less than four sides of the display area DA.

The display panel may be a panel displaying images, and may be an organic light emitting diode ("OLED") panel. The display panel may be one of a liquid crystal display ("LCD") panel, an electrophoretic display panel, a light emitting diode ("LED") panel, an inorganic electro luminescent ("EL") display panel, a field emission display ("FED") panel, a surface conduction electron-emitter display ("SED") panel, a plasma display panel ("PDP"), or a cathode ray tube ("CRT") display panel. However, the above is only listed by way of example, and any kind of display panels that are currently developed, commercialized, or can be implemented according to future technology development can be used as the display panel according to an exemplary embodiment of the present invention.

The display panel may include a substrate 111, a sealing substrate 201 positioned above the substrate 111, a pixel unit 150, and a sealing member 290, but exemplary embodiments of the present invention are not limited thereto. As an example, the substrate 111 may be sealed by a thin film encapsulation layer (e.g., instead of the sealing substrate 201). As an example, the pixel unit 150 may be disposed on the substrate 111 and the sealing substrate 201 may be disposed on the pixel unit 150. Thus, the pixel unit 150 may be in direct contact with the surface of the substrate 111 facing the sealing substrate 201, and the sealing substrate 201 may be in direct contact with a surface of the pixel unit 150 facing away from the substrate 111.

The substrate 111 may include a display area DA (e.g., in which display is performed by light emission) and a non-display area NDA located outside the display area DA (e.g., adjacent to the display area DA). The non-display area NDA may be adjacent to the display area DA. The non-display area NDA may be arranged at four sides of the display area DA in a plan view. Thus, the non-display area NDA may surround the display area DA in a plan view. However, exemplary embodiments of the present invention are not limited thereto. For example, the non-display area NDA may be arranged at less than four sides of the display area DA. A plurality of pixels may be arranged in the display area DA of the substrate 111. The plurality of pixels may be included in the pixel unit 150.

The non-display area NDA may include a pad area PA at which a plurality of pad wirings 270 which receive an external signal and transmit the external signal to the pixel unit 150 are formed. At least one driving chip 250 may be disposed at the pad area PA.

The pixel unit 150 may be disposed on the substrate 111. The pixel unit 150 may include an OLED and a wiring unit driving the OLED. The wiring unit of the pixel unit 150 may be connected to the driving chip 250. Any element other than the OLED that is applicable to display devices may be used to form the pixel unit 150.

The sealing substrate 201 may be spaced apart from the substrate 111 with the pixel unit 150 between the sealing substrate 201 and the substrate 111. The sealing substrate 201 may be laminated on the substrate 111 through the use of the sealing member 290. The sealing substrate 201 may substantially cover and may protect the pixel unit 150. A planar area of the sealing substrate 201 may be less than that of the substrate 111. Accordingly, the pad area PA of the substrate 111 may be exposed by the sealing substrate 201. Thus, a portion of the substrate 111 may overhang the sealing substrate 201. The driving chip 250 described herein may be disposed on the portion of the substrate 111 overhanging the sealing substrate 201. Thus, the driving chip 250 may be spaced apart from the sealing substrate, and/or from the pixel unit. The driving chip 250 may also be spaced apart from the flexible printed circuit board 240 described herein.

A polarization plate may be disposed on the sealing substrate 201. The polarization plate may substantially prevent a reflection of light, such as external light.

The printed circuit board 280 may be a circuit board applying driving signals to the display panel. A timing controller which generates a control signal for driving the display panel and a power voltage generator which generates a power voltage may be included in the printed circuit board 280.

The printed circuit board 280 may be disposed on a surface of the display panel. For example, the printed circuit board 280 may be disposed on a back surface of the display panel. Generally, the display panel displays images on the side of an upper surface of the display panel, and the back surface of the display panel thus becomes an area that the user cannot see. Accordingly, the printed circuit board 280 may be disposed on the side of the back surface of the display panel, which may substantially maximize space efficiency and hide the configuration from a user's sight. However, the above is merely given by way of example, and the printed circuit board 280 may be disposed on a side surface of the display panel and the printed circuit board 280 and the flexible printed circuit board 240 may be unitarily formed, where desired.

An exemplary material such as a glass frit may be included in the sealing member 290.

According to an exemplary embodiment of the present invention, the flexible printed circuit board 240 and the driving chip 250 may operate as circuit members. Thus, the flexible printed circuit board 240 and the driving chip 250 may each be interchangeably referred to herein as circuit members. As an example, the body portion 251 of the driving chip 250 may include at least one circuit formed on the body portion 251. Such circuit members may be electrically connected to each other. For example, the circuit members 240 and 250 may be electrically connected to the pad wiring 270 of the pad area PA by an anisotropic conductive film, or may be in direct contact with the pad wiring 270 of the pad area PA and may be connected thereto. For example, the circuit members 240 and 250 may be in direct contact with the pad wiring 270 of the pad area PA and may be electrically connected thereto (e.g, through an ultrasonic bonding process).

When the flexible printed circuit board 280 is electrically connected to the display panel and the printed circuit board 280, the flexible printed circuit board 240 may provide an electrical connection between the display panel and the printed circuit board 280. The flexible printed circuit board 240 may be connected to the pad wiring 270 of the pad area PA (e.g., by an anisotropic conductive film or through a direct contact).

The flexible printed circuit board 240 may include a base film and a wiring pattern on the base film, and may further include a cover film on the wiring pattern (e.g., when viewed in a cross-sectional view).

The base film and the cover film may each include a material having relatively high flexibility, insulation, and heat resistance, e.g., polyimide, but exemplary embodiments of the present invention are not limited thereto.

The wiring pattern may be disposed between the base film and the cover film. The wiring pattern may transmit a predetermined electric signal. The wiring pattern may include a metal material such as copper (Cu). Tin, silver, or nickel may be plated on a surface of the copper.

Figure 3:
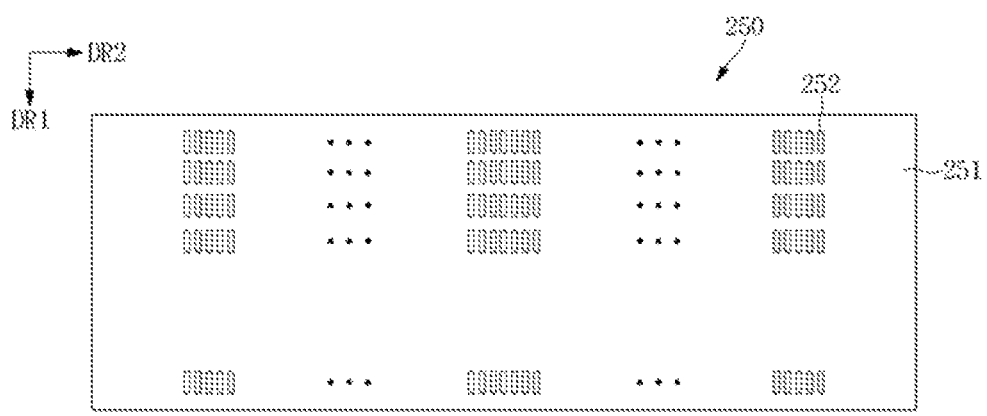
FIG. 3 is a plan view of a lower surface of a driving chip according to an exemplary embodiment of the present invention.
Figure 4A:
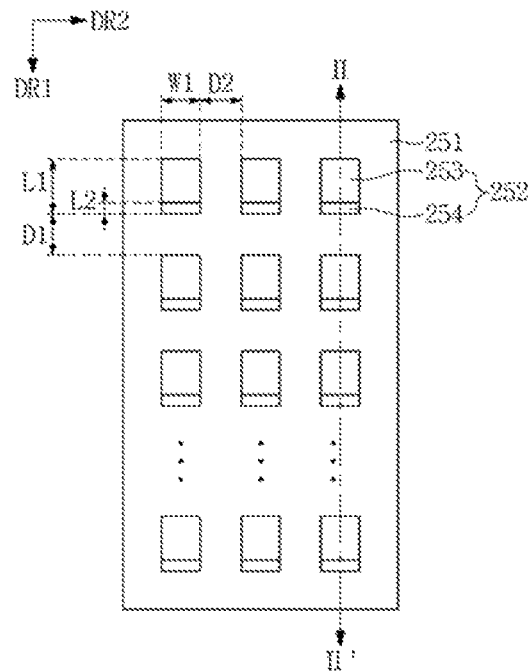
FIG. 4A is an enlarged view of a driving chip according to an exemplary embodiment of the present invention.
Figure 4B:
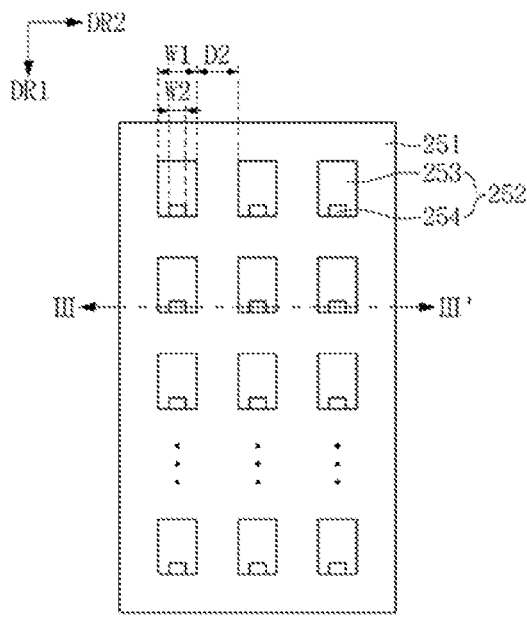
FIG. 4B is an enlarged view of a driving chip according to an exemplary embodiment of the present invention.
Figure 5:
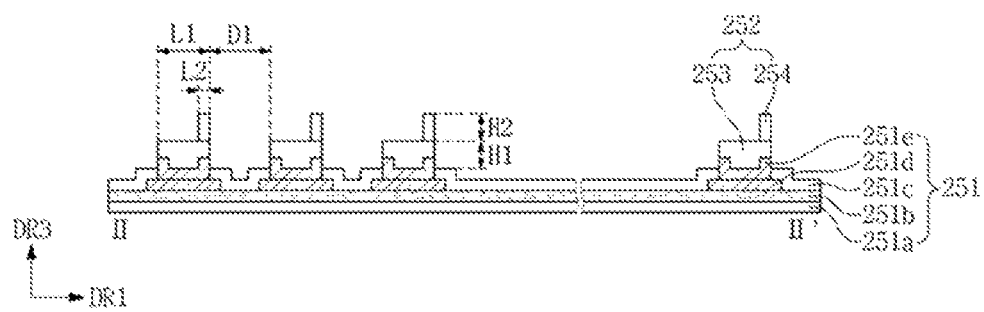
FIG. 5 is a cross-sectional view taken along line II-II' of FIG. 4A.
Figure 6:
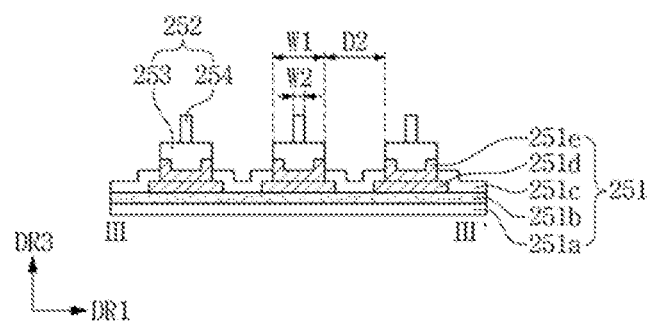
FIG. 6 is a cross-sectional view taken along line of FIG. 4B.

FIG. 3 is a plan view of a lower surface of a driving chip according to an exemplary embodiment of the present invention. FIG. 4A is an enlarged view of a driving chip according to an exemplary embodiment of the present invention. FIG. 4B is an enlarged view of a driving chip according to an exemplary embodiment of the present invention. FIG. 5 is a cross-sectional view taken along line II-II' of FIG. 4A. FIG. 6 is a cross-sectional view taken along line of FIG. 4B.

The driving chip 250 may be connected to the pad electrode 270. The driving chip 250 may control the light emission of the OLED 210. The driving chip 250 may be an integrated circuit ("IC") chip, e.g., a driving IC.

Referring to FIGS. 3 to 6, the driving chip 250 may include a body portion 251 and a bump 252 extending from the body portion 251. The bump 252 may include a plurality of bumps. The bump 252 may be connected to the pad electrode 270. The bumps 252 may each extend in a third direction DR3, which is described below in more detail with respect to first direction DR1 and second direction DR2.

The body portion 251 may include wiring layers 251d and/or 251e (see, e.g., FIG. 5) which may include a scan driver, or a data driver, which may drive the pixels. The bump 252 may be formed on the body portion 251 which overlaps the pad electrode 270 (e.g., along the third direction DR3).

The driving chip 250 may be mounted at the pad area PA of the substrate 111 in a chip on glass (COG) manner. The driving chip 250 may be electrically connected to the pad electrode 270. The driving chip 250 may be electrically connected to the pad electrode by the bumps 252 described herein.

In an exemplary embodiment of the present invention, the driving chip 250 may be formed in an area outside the non-display area NDA. For example, the display device described herein might not include a non-display area. As an example, the driving chip 250 may be mounted on a flexible printed circuit board in a chip on film (COF) manner. As an example, a tape carrier package (TCP) in which the driving chip 250 is mounted on a film in the form of a chip may be applied to the OLED display device.

The bump 252 may be located at a lower surface than an uppermost surface of the driving chip 250 opposite the substrate 111. Thus, the bump 252 may be disposed below an uppermost surface of the driving chip 250 opposite the substrate 111, while still being spaced apart from a surface of the substrate 111 facing the driving chip 250. Referring to FIGS. 3 to 4B, the bumps 252 may be arranged in a matrix form along the first direction DR1 or the second direction DR2. A third direction DR3 may be perpendicular to the first and second direction DR1 and DR2. Thus, the third direction DR3 may be orthogonal to a plane extending in the first and second direction DR1 and DR2. As an example, to substantially prevent a part of the bump 252 from melting down due to frictional heat and from causing a short circuit between the bumps 252 in the ultrasonic bonding process, the bumps 252 may be spaced apart from each other (e.g., by a distance D1 of from about 10 μm to about 20 μm) along the first direction DR1, and may be spaced apart from each other (e.g., by a distance D2 of from about 10 µm to about 20 µm) along the second direction DR2.

Referring to FIGS. 3 to 6, each bump 252 may include a first bump 253 and a second bump 254.

The first bump 253 may have a substantially quadrangular shape on a plane. For example, the first bump 253 may have a substantially square or rectangular shape when viewed in a plan view (e.g., when viewed along the third direction DR3). For example, the first bump 253 may have opposite end portions opposing each other along the first direction DR1. For example, the first bump 253 may include four side surfaces that are respectively substantially perpendicular to each other, in addition to top and bottom surfaces that are substantially perpendicular to each of the four side surfaces.

The first bump 253 may include or be formed of metal or metal oxide having relatively high conductivity. For example, the first bump 253 may include gold, chromium, silver, molybdenum, aluminum, copper, titanium, indium-tin-oxide, or indium-zinc-oxide. As an example, the first bump 253 may include an alloy of two or more metals or metal oxides among the above metals.

The second bump 254 may have a quadrangular shape on a plane. For example, the second bump 254 may have a substantially square or rectangular shape when viewed in a plan view (e.g., when viewed along the third direction DR3). For example, the second bump 254 may include four side surfaces that are respectively substantially perpendicular to each other, in addition to top and bottom surfaces that are substantially perpendicular to each of the four side surfaces. However, exemplary embodiments of the present invention are not limited thereto. For example, a shape of either the first bump 253 or the second bump 254 may be varied, as desired.

Referring to FIGS. 4A and 4B, the second bump 254 may be immediately adjacent to at least one of the opposite end portions of the first bump 253. For example, opposite side surfaces of the second bump 254 may be respectively aligned with opposite side surfaces of the first bump 253 (e.g., along the third direction DR3). For example, the second bump 254 may be immediately adjacent any one of the opposite end portions of the first bump 253 that oppose each other along the first direction DR1. For example, the second bump 254 may be immediately adjacent to one of the opposite end portions of the first bump 253 that oppose each other along the first direction DR1. As an example, one second bump 254 may be immediately adjacent to and aligned with one side surface of the first bump 253. Alternatively, one second bump 254 may be spaced apart from opposite side surfaces of the first bump 253, and may project in the third direction DR3 from a substantially central portion of the first bump 253.

The second bump 254 may have a planar area less than a planar area of the first bump 253 on a plane (e.g., on a plane defined by the first direction DR1 and/or the second direction DR2). In the ultrasonic bonding process, the second bump 254 may come into direct contact with the pad wiring 270 of the pad area PA. Since a contact area between the second bump 254 and the pad wiring 270 may be relatively small, a relatively high pressure per unit area may be applied to the second bump 254 and the pad wiring 270 such that the second bump 254 may be stably connected to the pad wiring 270 of the pad area PA.

The second bump 254 may include or be formed of metal or metal oxide having relatively high conductivity. For example, the second bump 254 may include gold, chromium, silver, molybdenum, aluminum, copper, titanium, indium-tin-oxide, or indium-zinc-oxide. As an example, the second bump 254 may include an alloy of two or more metals or metal oxides among the above metals.

According to an exemplary embodiment of the present invention, referring to FIGS. 4A and 5, the second bump 254 may have a length L2 which is less than a length L1 of the first bump 253 in the first direction DR1, and may have a length W1 which is substantially equal to a length of the first bump 253 in the second direction DR2. For example, the second bump 254 may have a length L2 of from about 10 µm to about 20 µm in the first direction DR1, and may have a length W1 of from about 8 µm to about 15 µm in the second direction DR2.

According to an exemplary embodiment of the present invention, referring to FIGS. 4A and 5, the first bump 253 may have a planar area of about 400 µm² or more with respect to the first direction DR1. For example, the first bump 253 may be exposed by about 400 µm² or more with respect to the first direction DR1. For example, the first bump 253 may have a length L1 of about 60 µm or more in the first direction DR1 and a length W1 of from about 8 µm to about 15 µm in the second direction DR2. The second bump 254 may have a length L2 of from about 10 µm to about 20 µm in the first direction DR1 and a length W1 of from about 8 µm to about 15 µm in the second direction DR2. Accordingly, a part of the first bump 253 corresponding to a quadrangular shape having a length of about 50 µm or more in the first direction DR1 and a length of about 8 µm or more in the second direction DR2 may be exposed.

According to an exemplary embodiment of the present invention, referring to FIGS. 4B and 6, the second bump 254 may have a length W2 which is less than a length W1 of the first bump 253 in the second direction DR2 (W1>W2). The second bump 254 according to an exemplary embodiment of the present invention may have a planar area less than that of the first hump 253 and may have a relatively less contact area with the pad wiring 270, such that a pressure applied per unit area may be increased. Accordingly, the second hump 254 and the pad wiring 270 may be more stably connected to each other. Thus, a defect or failure rate in a display device according to an exemplary embodiment of the present invention may be reduced or eliminated.

According to an exemplary embodiment of the present invention, referring to FIG. 4B, the first bump 253 may have a planar area of about 400 µm² or more with respect to the first direction DR1. For example, the first bump 253 may be exposed by an area of about 400 m² or more with respect to the first direction DR1. For example, the first bump 253 may have a length L1 of about 60 µm or more in the first direction DR1 and a length W1 of from about 8 µm to about 15 µm in the second direction DR2, and the second bump 254 may have a length L2 of from about 10 µm to about 20 µm in the first direction DR1 and a length W2 which is less than that of the first bump 253 in the second direction DR2. Accordingly, a part of the first bump 253 corresponding to a quadrangular shape having a length of about 50 µm or more in the first direction DR1 and a length of about 8 µm or more in the second direction DR2 may be exposed.

According to an exemplary embodiment of the present invention, when the pad electrode 270 of the display panel and the bump 252 of the driving chip 250 are bonded to each other through the ultrasonic bonding process, a pressure may be applied to the second bump 254 which has a planar area less than that of the first bump 253 and the pad wiring 270 located at the pad area PA, and the magnitude of the pressure applied per unit area may be increased. Accordingly, the bump 252 of the driving chip 250 may be stably bonded to the pad wiring 270. In addition, according to an exemplary embodiment of the present invention, a contact test may be performed on each of the first humps 253 before the driving chip 250 is bonded to the pad wiring 270 of the display panel, and the first bump 253 may be exposed by an area of about 400 μm² or more to perform the contact test.

Referring to FIGS. 5 and 6, the body portion 251 may include a silicon substrate 251a, an oxide layer 251b, an inorganic layer 251c, and a wiring layer 251d and 251e.

The silicon substrate 251a may function as a base for forming the wiring layer 251d and 251e. For example, the silicon substrate 251a may include or be formed of silicon (Si).

The oxide layer 251b may include or be formed of silicon oxide which may be formed by oxidizing a surface of the silicon substrate 251a, but exemplary embodiments of the present invention are not limited thereto. In an exemplary embodiment of the present invention, the silicon substrate 251a may include an insulating material which is separately deposited or applied.

The inorganic layer 251c may include or be formed of a silicon nitride layer, a silicon oxide layer, or a silicon nitride layer. However, exemplary embodiments of the present invention are not limited thereto.

The wiring layer 251d and 251e may include an electronic element such as a resistor, a capacitor, or an inductor, and a wiring. The wiring may electrically connect the electronic elements to each other. The wiring layer 251d and 251e may be electrically connected to the bump 252. For example, the wiring layer 251d and 251e may be in direct contact with the first bump 253 and may be electrically connected thereto.

Referring to FIG. 5, the second bump 254 may have a shape protruding from the first bump 253. For example, the first hump 253 may have a height H1 of from about 3 μm to about 5 μm projecting from an upper surface of the wiring layer 251d and 251e, and may have a height H2 of from about 6 μm to about 10 μm projecting from an upper surface of the first bump 253. As an example, before the ultrasonic bonding process, the second bump 254 may have a height larger than that of the first bump 253.

The second bump 254 may be formed unitarily with the first bump 253. For example the first bump 253 and the second bump 254 may be formed substantially simultaneously, such as through a single continuous process. However, exemplary embodiments of the present invention are not limited thereto, and the second bump 254 may be formed separately from the first hump 253 (e.g., by a second and separate process).

An exemplary embodiment of the present invention will be described in more detail below with reference to FIGS. 7A, 7B and 8. Descriptions of components that are the same or substantially the same as those described above may be omitted below.

Figure 7A:
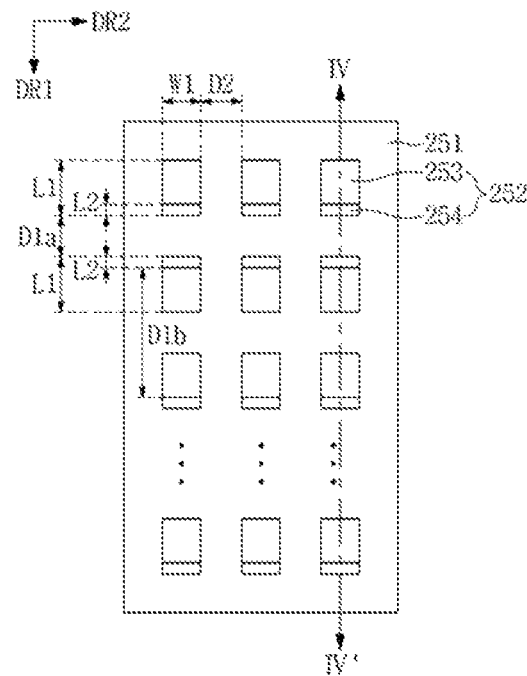
FIG. 7A is an enlarged view of a driving chip according to an exemplary embodiment of the present invention.

FIG. 7A is an enlarged view of a driving chip according to an exemplary embodiment of the present invention. FIG. 7B is an enlarged view of a driving chip according to an exemplary embodiment of the present invention. FIG. 8 is a cross-sectional view taken along live IV-IV' of FIG. 7A.

Figure 7B:
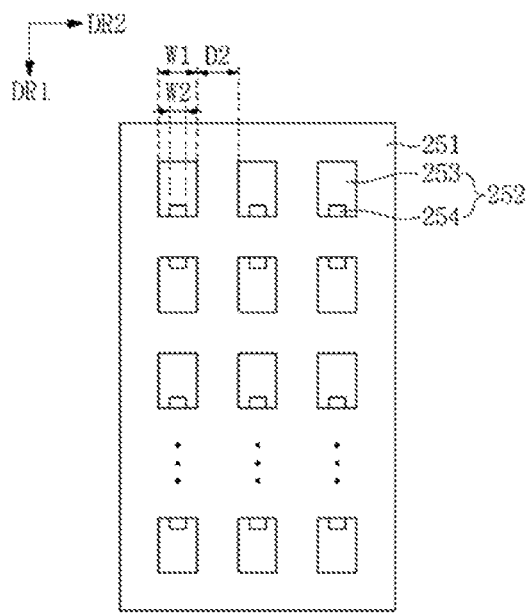
FIG. 7B is an enlarged view of a driving chip according to an exemplary embodiment of the present invention.
Figure 8:
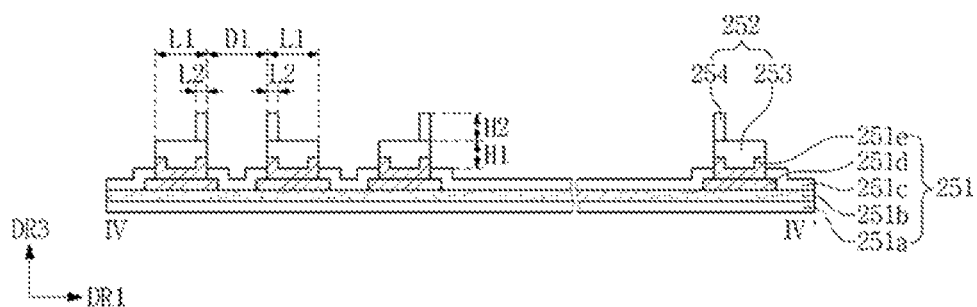
FIG. 8 is a cross-sectional view taken along line IV-IV' of FIG. 7A.

According to an exemplary embodiment of the present invention, referring to FIGS. 7A, 7B and 8, the second bump 254 may be immediately adjacent to any one of opposite end portions of the first bump 253 that oppose each other along the first direction DR1. For example, the second bump 254 may be disposed on one of the opposite end portions of the first hump 253 that oppose each other along the first direction DR1. For example, a side surface of one second bump 254 may be aligned with a side surface of one first bump 253 along the third direction DR3.

According to an exemplary embodiment of the present invention, the plurality of second bumps 254 may have different gaps from each other with respect to the first direction DR1. For example, a second bump 254 that is located secondly along the first direction DR1 may be spaced apart from a second bump 254 that is located firstly along the first direction DR1 and a second bump 254 that is located thirdly along the first direction DR1 by gaps different from each other. For example, a distance D1a between the second bump 254 located secondly along the first direction DR1 and the second bump 254 located firstly along the first direction DR1 may be less than a distance D1b between the second bump 254 located secondly along the first direction DR1 and the second bump 254 located thirdly along the first direction DR1.

The second hump 254 may have a planar area less than that of the first bump 253 on a plane (e.g., on a plane defined by the first and/or second direction DR1 and DR2). In the ultrasonic bonding process, the second hump 254 may come into direct contact with the pad wiring 270 of the pad area PA. Since a contact area between the second bump 254 and the pad wiring 270 is relatively small, a relatively high pressure per unit area may be applied to the contact area such that the second bump 254 may be stably connected to the pad wiring 270 of the pad area PA.

According to an exemplary embodiment of the present invention, when the pad electrode 270 of the display panel and the bump 252 of the driving chip 250 are bonded to each other through the ultrasonic bonding process, a pressure may be applied to the second bump 254 which has a relatively small planar area and the pad wiring 270 which is located at the pad area PA, and the magnitude of the pressure applied per unit area may be increased. Accordingly, the bump 252 of the driving chip 250 may be stably bonded to the pad wiring 270. In addition, according to an exemplary embodiment of the present invention, a contact test may be performed on each of the first humps 253 before the driving chip 250 is bonded to the pad wiring 270 of the display panel, and the first bump 253 may have a planar area of about 400 μm² or more to perform the contact test. For example, the first bump 253 may be exposed by an area of about 400 μm² or more.

An exemplary embodiment of the present invention will be described in more detail below with reference to FIGS. 9A, 9B and 10. Descriptions of components that are, the same or substantially the same as those described above may be omitted below.

Figure 9A:
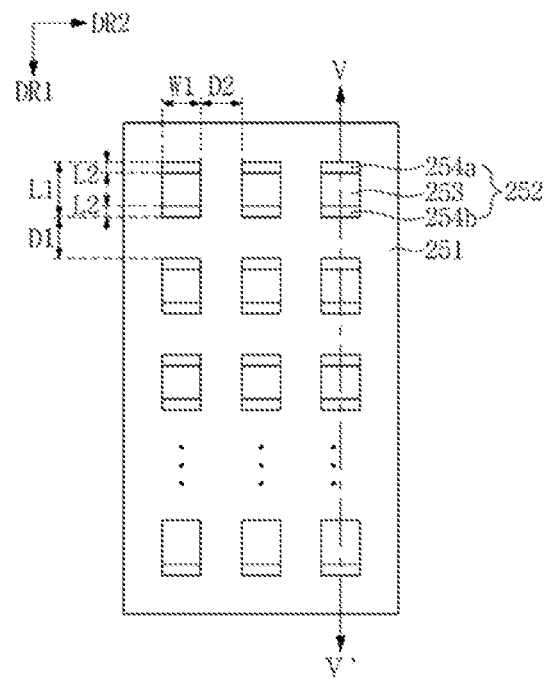
FIG. 9A is an enlarged view of a driving chip according to an exemplary embodiment of the present invention.

FIG. 9A is an enlarged view of a driving chip according to an exemplary embodiment of the present invention. FIG. 9B is an enlarged view of a driving chip according to an exemplary embodiment of the present invention. FIG. 10 is a cross-sectional view taken along line V-V' of FIG. 9A.

Figure 9B:
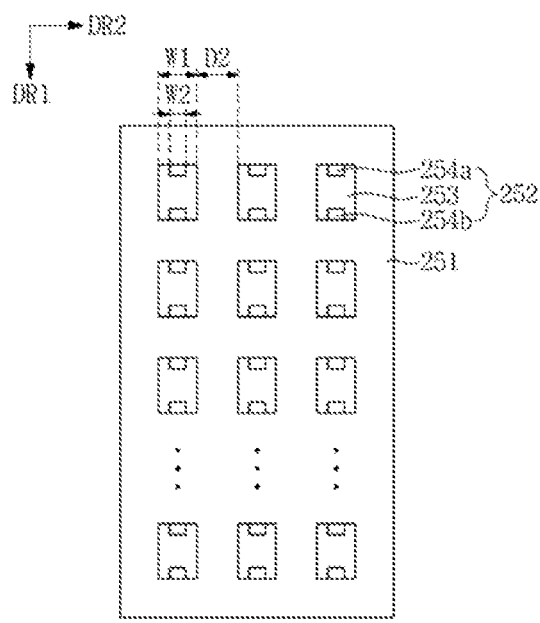
FIG. 9B is an enlarged view of a driving chip according to an exemplary embodiment of the present invention.
Figure 10:
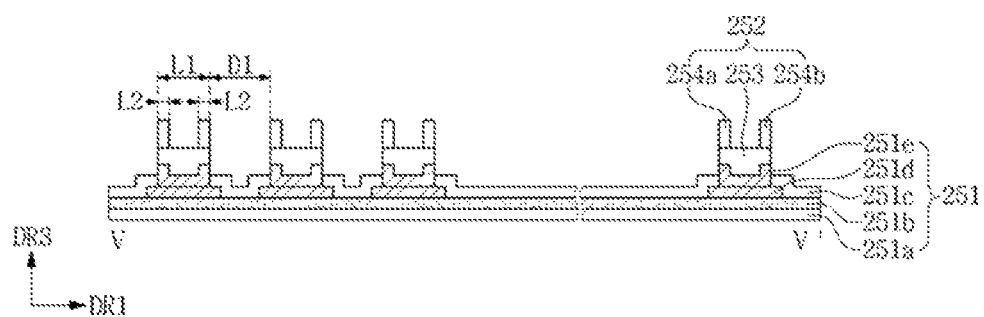
FIG. 10 is a cross-sectional view taken along line V-V' of FIG. 9A.

Referring to FIGS. 9A, 9B and 10, second bumps 254a and 254b may be respectively disposed at opposite end portions of the first bump 253. For example, referring to FIGS. 9A to 9B, the second bumps 254a and 254b may be disposed at the opposite end portions of the first bump 253 that oppose each other along the first direction DR1. For example, opposite side surfaces of the second bumps 254a and 254b may be respectively aligned with opposite side surfaces of the first bump 253 (e.g., along the third direction DR3). For example, two second bumps 254a and 254b may be immediately adjacent to the opposite end portions of the first bump 253 that oppose each other along the first direction DR1. For example, one of the two second bumps, e.g., the second bump 254a, may be disposed on one of the opposite end portions of the first bump 253 that oppose each other along the first direction DR1, and the other of the two second bumps, e.g., the second bump 254b, may be disposed on the other of the opposite end portions of the first bump 253 that oppose each other along the first direction DR1.

The second bumps 254a and 254b may each have a planar area less than a planar area of the first bump 253 on a plane (e.g., a plane defined by the first and/or second directions DR1 and DR2). In the ultrasonic bonding process, the second bumps 254a and 254b may come into direct contact with the pad wiring 270 of the pad area PA. Since a contact area between the second bumps 254a and 254b and the pad wiring 270 is relatively small, a relatively high pressure per unit area is applied to the contact area such that the second bumps 254a and 254b may be stably connected to the pad wiring 270 of the pad area PA.

According to an exemplary embodiment of the present invention, referring to FIGS. 9A and 10, the first bump 253 may have a length L1 which is larger than about 70 μm with respect to the first direction DR1. As an example, a contact test may be performed on the first bump 253 before the driving chip 250 is bonded to the pad wiring 270 of the display panel, and the first bump 253 may have the length L1 of about 70 μm or more in the first direction DR1 (L1>70 μm) before performing the contact test.

According to an exemplary embodiment of the present invention, referring to FIGS. 9A and 10, the second bumps 254a and 254b may have a length W1 which is substantially equal to that of the first bump 253 in the second direction DR2, and may have a length L2 which is less than the length L1 of the first bump 253 in the first direction DR1. For example, the second bumps 254a and 254b may have a length W1 of from about 8 μm to about 15 μm in the second direction DR2, and may have a length L2 of from about 10 μm to about 20 μm in the first direction DR1.

According to an exemplary embodiment of the present invention, referring to FIGS. 9B and 10, the second bumps 254a and 254b may have a length W2 which is less than a length W1 of the first bump 253 in the second direction DR2, and may have a length L2 which is less than a length L1 of the first bump 253 in the first direction DR1. For example, the second bumps 254a and 254b may have a length W1 of from about 8 μm to about 15 μm in the second direction DR2, and may have a length L2 of from about 10 μm to about 20 μm in the first direction DR1.

According to an exemplary embodiment of the present invention, when the pad electrode 270 of the display panel and the bump 252 of the driving chip 250 are bonded to each other through the ultrasonic bonding process, a pressure may be applied to the second bump 254 which has a relatively small planar area and the pad wiring 270 which is located at the pad area PA, and the magnitude of the pressure applied per unit area may be increased. Accordingly, the bump 252 of the driving chip 250 may be stably bonded to the pad wiring 270. In addition, according to an exemplary embodiment of the present invention, a contact test may be performed on each of the first bumps 253 before the driving chip 250 is bonded to the pad wiring 270 of the display panel, and the first bump 253 may have a planar area of about 400 μm² or more to perform the contact test. For example, the first bump 253 may be exposed by an area of about 400 μm² or more.

A display device according to an exemplary embodiment of the present invention will be described in more detail below with reference to FIG. 11. Descriptions of components that are the same or substantially the same as those described above may be omitted below.

Figure 11:
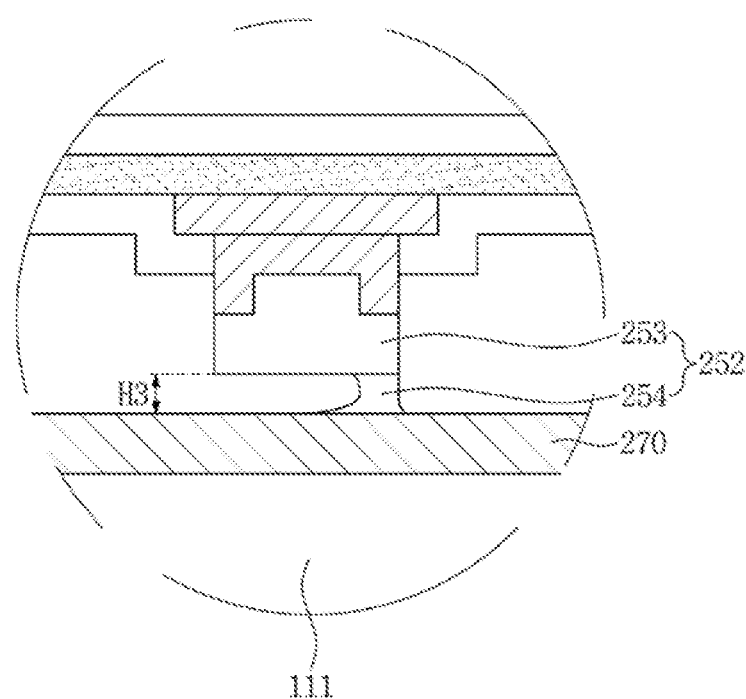
FIG. 11 is an enlarged view of a contact portion between a pad wiring and a driving chip according to an exemplary embodiment of the present invention.

FIG. 11 is an enlarged view of a contact portion between a pad wiring and a driving chip according to an exemplary embodiment of the present invention.

Referring to FIG. 11, the driving chip 250 may be mounted on a display panel through an ultrasonic bonding process. For example, the second bump 254 of the driving chip 250 may come into direct contact with the pad wiring 270 of the pad area PA through the ultrasonic bonding process and may be electrically connected thereto.

According to an exemplary embodiment of the present invention, the driving chip 250 may be mounted on at least one of the pad area PA of the substrate 111 or the flexible printed circuit board 240 connected to the substrate.

According to an exemplary embodiment of the present invention, the second bump 254 may be bonded to the pad wiring 270 in the ultrasonic bonding process by surfaces of the second bump 254 and the pad wiring 270 that contact each other.

The ultrasonic bonding process may be a process in which a mechanical vibration energy in an ultrasonic frequency range is applied along with a pressure to metals, to be bonded, to generate a frictional heat on the contact surface, such that the metal surface may be plastically deformed substantially instantaneously. Accordingly, different metals may be bonded to each other. Through the ultrasonic bonding process, the second hump 254 may be directly bonded to the pad wiring 270 of the substrate to be electrically connected to the pad wiring 270.

According to an exemplary embodiment of the present invention, an upper surface of the second bump 254 may melt down due to the frictional heat in the ultrasonic bonding process to flow to the periphery of the second bump 254. Accordingly, a height H3 of the second bump 254 may become less than a height 112 of the second bump 254 before the ultrasonic bonding process. For example, the second bump 254 may have a height 113 of from about 3 μm to about 5 μm with respect to the first bump 253 (e.g., in the third direction DR3). As an example, the first bump 253 may be spaced apart from the pad wiring 270 by a distance H3 of from about 3 μm to about 5 μm.

As described herein, according to an exemplary embodiment of the present invention, the driving chip may include the second hump which protrudes from the first bump, and thus a sufficient pressure for bonding may be transmitted to the second bump of the driving chip and the wirings of the display panel. Accordingly, the bump of the driving chip may be stably bonded to the wirings of the display panel.

While the present invention has been illustrated and described with reference to the exemplary embodiments thereof, it will be apparent to those of ordinary skill in the art that various changes in form and detail may be made thereto without departing from the spirit and scope of the present invention.

What is claimed is:

1. A driving chip comprising:
   a body portion comprising a circuit;
   the circuit comprising a first wiring layer, an inorganic layer, a first bump electrically connected to the body portion, and a second bump, sequentially arranged on the body portion in a third direction perpendicular to an upper surface of the body portion,
   wherein the second bump disposed on the first bump has a planar area less than a planar area of the first bump on a plane defined along a first direction which is parallel to the upper surface of the body portion, and wherein an upper surface of the second bump is externally exposed, and wherein a center portion of the first bump does not overlap with the second bump in a plan view.

2. The driving chip of claim 1, wherein the first bump has a planar area of at least about 400 μm2, wherein the first bump has a length of about 60 μm or more in the first direction, wherein a side surface of the second bump is aligned with a side surface of the first bump along the second direction, in a plan view, and wherein the second direction is orthogonal to the first direction.

3. The driving chip of claim 1, wherein the first bump has a height of from about 3 μm to about 5 μm in the third direction orthogonal to the plane defined by the first direction and the second direction.

4. The driving chip of claim 1, wherein the second bump has a length less than a length of the first bump in the first direction.

5. The driving chip of claim 4, wherein the second bump has a length of from about 10 μm to about 20 μm in the first direction.

6. The driving chip of claim 4, wherein the second bump has a length of from about 8 μm to about 15 μm in the second direction.

7. The driving chip of claim 4, wherein the second bump has a length substantially equal to a length of the first bump in the second direction.

8. The driving chip of claim 4, wherein the second bump has a length less than a length of the first bump in the second direction.

9. The driving chip of claim 4, wherein the second bump comprises a plurality of second bumps, and wherein each second bump of the plurality of second bumps has a side surface respectively aligned with a corresponding side surface of the first bump along the second direction orthogonal to the first direction, in a plan view.

10. The driving chip of claim 9, wherein the second bumps of the plurality of second bumps are spaced apart from each other by a distance of about 50 μm or more in the first direction.

11. A display device comprising:

a substrate comprising a plurality of pixels;

a pad wiring applying a driving signal to a pixel of the plurality of pixels; and a driving chip generating the driving signal, wherein the driving chip comprises:

a body portion comprising a circuit generating the driving signal;

a first bump electrically connected to the body portion; and a second bump disposed on the first bump, having a planar area less than a planar area of the first bump on a plane defined along a first direction and a second direction parallel to an upper surface of the body portion, and in direct contact with the pad wiring, and wherein a center portion of the first bump does not overlap with the second bump in a plan view.

12. The display device of claim 11, wherein the first bump has a height of from about 3 μm to about 5 μm in a third direction orthogonal to the first direction and the second direction, wherein a side surface of the second bump is aligned with a side surface of the first bump along the second direction, in a plan view, and wherein the first bump has a length of about 60 μm or more in the first direction.

13. The display device of claim 11, wherein the first bump is spaced apart from the pad wiring by a distance of from about 3 μm to about 5 μm, and the second bump has a height of from about 3 μm to about 5 μm in a third direction orthogonal to the first direction and due second direction.

14. The display device of claim 11, wherein the second bump has a length less than a length of the first bump in the first direction.

15. The display device of claim 14, wherein the length of the second bump is from about 10 μm to about 20 μm in the first direction.

16. The display device of claim 14, wherein the length of the second bump is from about 8 μm to about 15 μm in the second direction.

17. The display device of claim 14, wherein the length of the second bump is substantially equal to a length of the first bump in the second direction.

18. The display device of claim 14, wherein the length of the second bump is less than a length of the first bump in the second direction.

19. The display device of claim 14, wherein the second bump comprises a plurality of second bumps each having side surfaces respectively aligned with side surfaces of the first bump along the second direction orthogonal to the first direction, in a plan view.

20. The display device of claim 11, further comprising a flexible printed circuit board connected to the substrate, wherein the substrate includes a display area in which the plurality of pixels are arranged and a non-display area adjacent to the display area, and wherein the pad wiring is disposed on at least one of the flexible printed circuit board and the non-display area.

* * * * *